United States Patent [19]

Hayakawa et al.

[11] Patent Number: 4,787,089
[45] Date of Patent: Nov. 22, 1988

[54] QUANTUM WELL SEMICONDUCTOR LASER DEVICE

[75] Inventors: Toshiro Hayakawa, Nara; Kohsei Takahashi, Tenri; Takahiro Suyama, Tenri; Masafumi Kondo, Tenri; Saburo Yamamoto, Nara, all of Japan

[73] Assignee: Sharp Kabushiki Kaisha, Osaka, Japan

[21] Appl. No.: 12,702

[22] Filed: Feb. 9, 1987

[30] Foreign Application Priority Data

Feb. 13, 1986 [JP] Japan ............... 61-31647

[51] Int. Cl.⁴ ............................. H01S 3/19
[52] U.S. Cl. ......................... 372/45; 357/16; 357/17
[58] Field of Search ............ 372/45, 46; 357/16, 357/17, 61

[56] References Cited

U.S. PATENT DOCUMENTS 4,261,771  4/1981  Dingle et al. .............. 148/175
4,644,378  2/1987  Williams ..................... 372/45

FOREIGN PATENT DOCUMENTS 166593    1/1986   European Pat. Off.
2413493  10/1974   Fed. Rep. of Germany.
60-235492 11/1985  Japan.

OTHER PUBLICATIONS

W. T. Tsang: Appl. Phys. Lett., 39(10), Nov. 15, 1981.
N. K. Dutta: J. Appl. Phys., 53(11), Nov. 1982.
H. Iwamura et al: Electronics Letters, vol. 19, No. 5, Mar. 3, 1983.
R. C. Miller et al, *Phys Rev B* (1984), 29:3740-43 (Miller).
J. J. Coleman et al, *Appl. Phys. Lett.* (1981), 38(2):63-65.

Primary Examiner—James W. Davie
Attorney, Agent, or Firm—Ciotti & Murashige, Irell & Manella

[57] ABSTRACT

A semiconductor laser device comprising a single or a plurality of quantum well regions formed by a superlatticed structure which is composed of alternate layers consisting of thin GaAs layers and thin $Al_xGa_{1-x}As$ ($0 < x < 1$) layers, each of said layers having a thickness of five molecular layers or less and each of said quantum well regions having a thickness in the range of 100 Å to 150 Å.

2 Claims, 4 Drawing Sheets

QUANTUM WELL SEMICONDUCTOR LASER DEVICE

BACKGROUND OF THE INVENTION

1. Field of the invention

This invention relates to a semiconductor laser device which oscillates laser light with an oscillation wavelength in the visible region, especially, a high quality semiconductor laser device which can be readily produced by molecular beam epitaxy.

2. Description of the prior art

In recent years, single thin crystal film growth techniques such as molecular beam epitaxy (MBE) and metal organic-chemical vapor deposition (MO-CVD), have rapidly advanced. By these growth techniques, it is possible to obtain epitaxial growth layers of extreme thinness, on the order of 10 Å. Due to the progress in these crystal growth techniques, it is possible to make laser devices based on device structures having very thin layers, which could not be easily manufactured by conventional liquid phase epitaxy. A typical example of these laser devices is the quantum well (QW) laser, in which the active layer has a thickness of 100 Å or less resulting in the formation of quantum levels therein, whereas the active layer of the conventional double-heterostructure (DH) laser has a thickness of several hundreds of angstroms or more. Thus, this QW laser is advantageous over the conventional DH laser in that the threshold current level is reduced, the temperature characteristics are excellent, and the transient characteristics are excellent. This has been reported by W.T. Tsang, Applied Physics Letters, vol. 39, No. 10, pp. 786 (1981); N. K. Dutta, Journal of Applied Physics, vol. 53, No. 11, pp. 7211 (1982); and H. Iwamura, T. Saku, T. Ishibashi, K. Otsuka, Y. Horikoshi, Electronics Letters, vol. 19, No. 5, pp. 180 (1983).

As mentioned above, by the use of single thin crystal film growth techniques such as MBE and MO-CVD, it is now possible to put high quality semiconductor lasers having a new multiple-layered structure into practical use.

A typical structure for conventional QW lasers is the AlGaAs laser with a graded-index separate-confinement heterostructure (GRIN-SCH). The AlAs mole fraction (i.e., x) in an $Al_xGa_{1-x}As$ mixed crystal in the active region of visible-light GRIN-SCH semiconductor lasers with an $Al_{0.3}Ga_{0.7}As$ mixed crystal quantum well is shown in FIG. 6. When the growth of the crystal layers of these laser devices is carried out by MBE, two Al cells must be used. One of the Al cells is opened so as to give an AlAs mole fraction of 0.3, and the other Al cell controls the cladding layers 3 and 7 and the GRIN regions 4 and 6. This is why two Al cells are required. Moreover, bulk AlGaAs is used as a quantum well layer, so that the radiation efficiency depending on the band structure of the bulk is decreased with the shortening of the wavelength, which causes difficulties in laser oscillation in the short-wavelength zone.

SUMMARY OF THE INVENTION

The semiconductor laser device of this invention, which overcomes the above-discussed and numerous other disadvantages and deficiencies of the the prior art, comprises a single or a plurality of quantum well regions formed by a superlatticed structure which is composed of alternative layers consisting of thin GaAs layers and thin $Al_xGa_{1-x}As$ ($0 < X < 1$) layers, each of said layers having a thickness of five molecular layers or less and each of said quantum well regions having a thickness in the range of 100 Å to 150 Å.

In a preferred embodiment, the threshold current level is maintained to be at the minimum when the quantum well width is in the range of 100 Å to 150 Å where the photoluminescent full-width lobe of half of the maximum becomes minimum.

Thus, the invention described herein makes possible the objects of (1) providing a high quality semiconductor laser device which oscillates a visible light at a low threshold current level; and (2) providing a semiconductor laser device which can be produced by a single Al cell by utilizing controllability in the layer thickness by molecular beam epitaxy.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The quantum well semiconductor laser device of this invention produces a visible light, which comprises a single or a plurality of quantum well regions having a thickness each in the range of 100 Å to 150 Å constituted by a superlatticed semiconductor layer. The superlatticed semiconductor layer is composed of alternate layers consisting of a plurality of GaAs layers and a plurality of AlGaAs layers, and moreover, each layer constituting the superlatticed semiconductor layer is extremely thin (e.g., five molecular layers or less), so that the semiconductor laser device of this invention can be produced using a single Al cell by molecular beam epitaxy. The above-mentioned structure of the semiconductor laser device of this invention is quite different from a conventional semiconductor laser device comprising a quantum well layer which is composed of a bulk AlGaAs alone. Moreover, although carrier theoretically exists under a three-dimensional condition in a superlattice, since the quantum well structure is formed by semiconductor layers having an energy-band structure which is different from that of bulk crystals, the carrier tends to exist under a two-dimensional condition within the superlattice, which allows the lowering of the threshold current level in the short wavelength zone. Especially, this invention provides an optimum width Lz of the quantum well region, which allows the lowering of the threshold current level.

EXAMPLE

Figure 1:
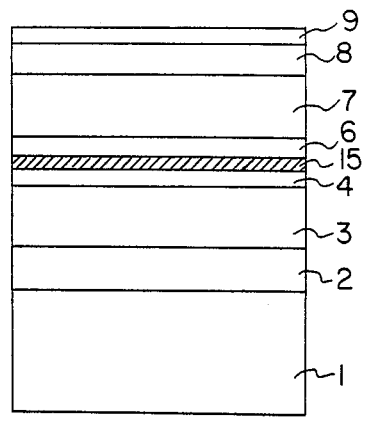
FIG. 1 is a front sectional view showing a semiconductor laser device of this invention.

FIG. 1 shows a semiconductor laser device of this invention, which is produced as follows: On an n-GaAs substrate (carrier density $Si=10^{18}$ cm$^{-3}$) 1, an n-GaAs buffer layer ($Si=10^{18}$ cm$^{-3}$, the thickness thereof being 0.5 μm) 2, an n-Al$_{0.7}$Ga$_{0.3}$As cladding layer ($Si=10^{18}$ cm$^{-3}$, the thickness thereof being 1.5 μm) 3, a non-doped Al$_x$Ga$_{1-x}$As GRIN layer (the thickness thereof being 0.2 μm) 4, a non-doped GaAs/Al$_{0.5}$Ga$_{0.5}$As superlatticed quantum well layer 15 with a thickness of twenty six molecular layers or about 74 Å (which is composed of alternate layers consisting of seven GaAs layers with a two molecular layer thickness each and six Al$_{0.5}$Ga$_{0.5}$As layers with a two molecular layer thickness each), a non-doped Al$_x$Ga$_{1-x}$As GRIN layer (the thickness thereof being 0.2 μm) 6, a p-Al$_{0.7}$Ga$_{0.3}$As cladding layer ($Be=10^{18}$ cm$^{-3}$, the thickness thereof being 1.5 μm) 7, a p-GaAs cap layer ($Be=10^{18}$ cm$^{-3}$, the thickness thereof being 0.5 μm) 8, and an n-Al$_{0.5}$Ga$_{0.5}$As current blocking layer ($Si=10^{18}$ cm$^{-3}$, the thickness thereof being 0.3 μm) 9 are successively grown by molecular beam epitaxy.

Figure 2:
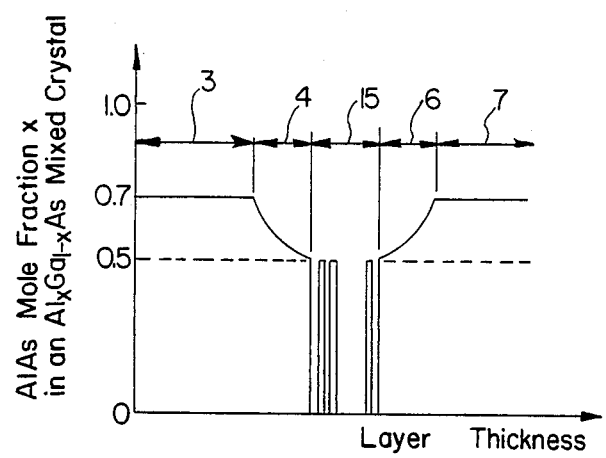
FIG. 2 is a graph showing the AlAs mole fraction (i.e., x) in an $Al_xGa_{1-x}As$ mixed crystal in the active region of the semiconductor laser device shown in FIG. 1.

FIG. 2 shows the AlAs mole fraction (i.e., x) in an Al$_x$Ga$_{1-x}$As mixed crystal in the vicinity of the quantum well layer 15. After the n-Al$_{0.7}$Ga$_{0.3}$As cladding layer 3 is grown within a molecular beam epitaxial apparatus, the shutter of a Si cell for supplying Si molecules is closed and the temperature of the Al cell for supplying Al molecules is lowered, resulting in the GRIN region 4 functioning as an optical guiding layer in which the AlAs mole fraction (i.e., x) varies from 0.7 to 0.5 according to the parabolic distribution. Then, closing and opening of the shutter of the Al cell are repeated so as to grow the superlatticed quantum well region 15 for laser oscillation which is composed of alternative layers consisting of a plurality of GaAs layers (the thickness of each layer being equal to a two molecular layer thickness) and a plurality of Al$_{0.5}$Ga$_{0.5}$As layers (the thickness of each layer being a two molecular layer thickness). Then, the shutter of the Al cell is opened and the thickness of the Al cell is raised, resulting in the GRIN region 6 functioning as an optical guiding layer in which the AlAs mole fraction (i.e., x) varies from 0.5 to 0.7 according to the parabolic distribution. Then, the shutter of a Be cell for supplying Be molecules is opened so as to grow the p-Al$_{0.7}$Ga$_{0.3}$As cladding layer 7. According to the above-mentioned molecular beam epitaxial growth technique, a visiblelaser light oscillation-operating area can be constructed using a single As cell such that the superlatticed quantum well region 15 is sandwiched between the GRIN regions 4 and 6, on the outer sides of both of which the cladding layers 3 and 7 are formed.

Then, a striped channel having a width of 5 μm is formed in the current blocking layer 9 by an etching technique using an HF etchant, resulting in a striped structure, within which current is confined. The position of the above-mentioned laser oscillation operating area corresponds to this current-confining striped structure. Then, the back face of the n-GaAs substrate 1 and the upper face of the current blocking layer 9 including the p-GaAs cap layer 8 are subjected to a vapor deposition treatment with materials of Au-Ge-Ni and Au-Zn, respectively, followed by heating to form an n-sided electrode of an alloy of Au-Ge-Ni and a p-sided electrode of an alloy of Au-Zn, respectively, resulting in a semiconductor laser device.

When a driving current was injected into the semiconductor laser device through the p-sided electrode and the n-sided electrode, a visible laser light with a wavelength of 705 nm was continuously emitted from the laser oscillation-operating area at a threshold current of 110 mA at room temperature.

Figure 3:
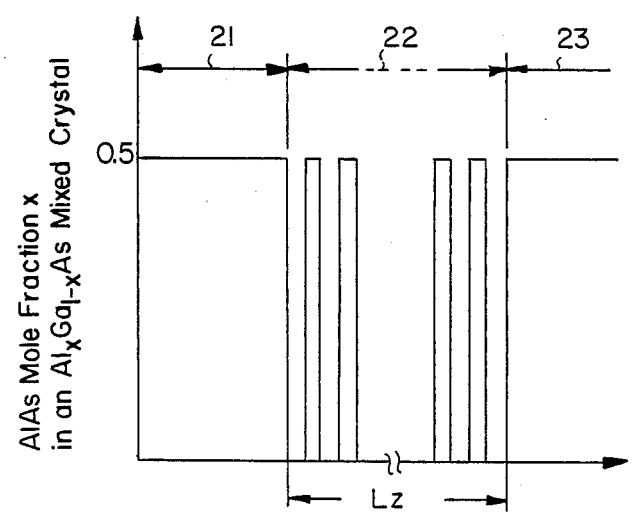
FIG. 3 is a graph showing the AlAs mole fraction (i.e., x) in an $Al_xGa_{1-x}As$ mixed crystal of a sample superlatticed quantum well structure produced so as to determine the optimum width of the quantum well.
Figure 4:
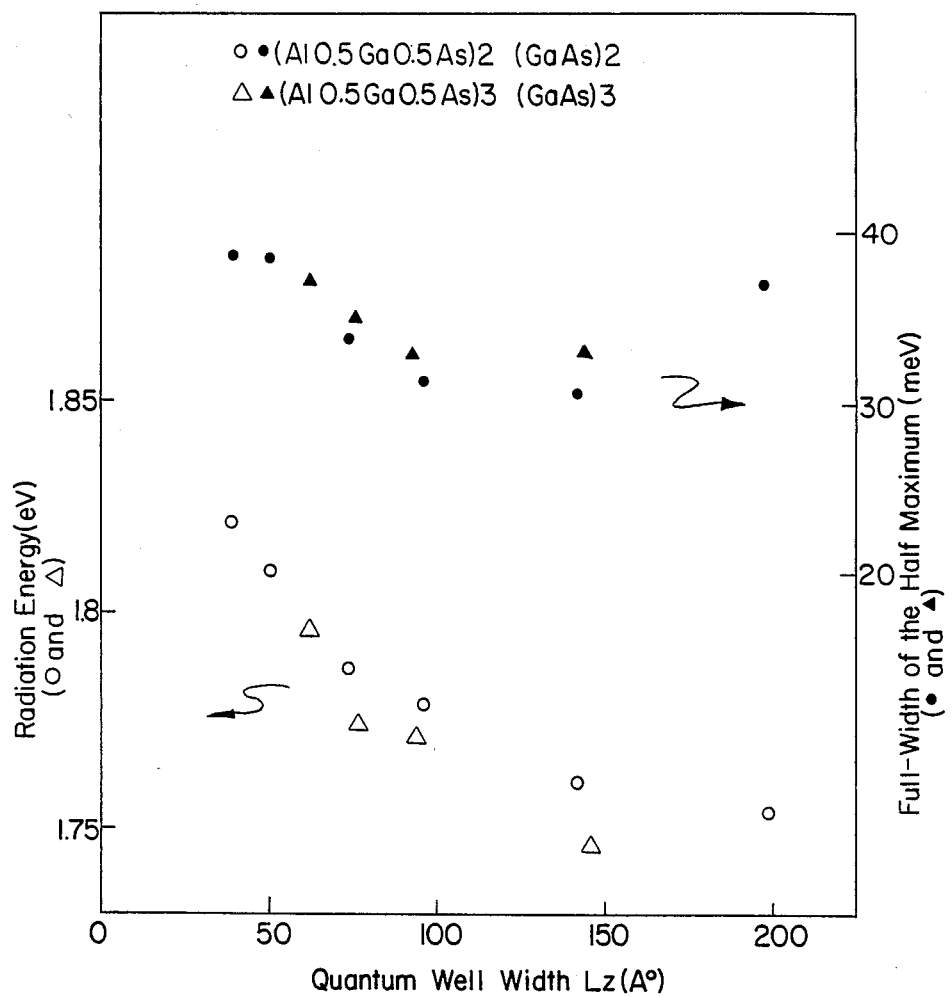
FIG. 4 is a graph showing the photoluminescent characteristics of the sample structure shown in FIG. 3.

FIG. 3 shows the AlAs mole fraction (i.e., x) in an Al$_x$Ga$_{1-x}$As mixed crystal in the cross section of a sample superlatticed quantum well structure, which is produced so as to determine the optimum width (i.e., thickness) Lz of the quantum well by the photoluminescent measurement. The sample superlatticed quantum well structure is produced by growing, on an Al$_{0.5}$Ga$_{0.5}$As barrier layer (the thickness thereof being 0.5 μm) 21, a superlatticed quantum well layer 22 and an Al$_{0.5}$Ga$_{0.5}$As barrier layer (the thickness thereof being 0.15 μm) 23 by molecular beam epitaxy. The superlatticed quantum well layer 22 is composed of alternate layers consisting of m GaAs layers with an n molecular layer thickness (e.g., n×2.83 Å) each and (m−1) Al$_{0.5}$Ga$_{0.5}$As layers with an n molecular layer thickness (e.g., n×2.83 Å) each. The width Lz of the quantum well is represented by the equation: $Lz = n \times (2m-1) \times 2.83$ Å. This superlatticed structure is referred to as (Al$_{0.5}$Ga$_{0.5}$As)n(GaAS)n hereinafter. FIG. 4 shows the dependence of both the peak energy and the full-width lobe of half of the maximum with regard to the photoluminescent spectra at room temperatures on the quantum well width Lz in the case that the (Al$_{0.5}$Ga$_{0.5}$As)n(GaAs)n constituting the above-mentioned superlatticed structure is an (Al$_{0.5}$Ga$_{0.5}$As)$_2$(GaAs)$_2$ or an (Al$_{0.5}$Ga$_{0.5}$As)$_3$, that is, in the case that the thickness of each of the AlGaAs and the GaAs is a two or three molecular layer thickness. FIG. 4 indicates that when the quantum well width Lz is reduced, quantum levels having high energies are formed in the same manner as those in the conventional quantum well constituted by bulk crystals such as GaAs and AlGaAs, resulting in an increase in the radiation energy. It is important that the full-width lobe of half of the maximum, which indicates the extent that the carrier tends to exist under a two-dimensional condition within the superlattice, is in an extremely narrow range. FIG. 4 also indicates that the full-width lobe of half of the maximum becomes minimum when the quantum well width Lz is in the range of 100 Å to 150 Å (i.e., 100 Å ≤ Lz ≤ 150 Å) regardless of the values of n.

Figure 5:
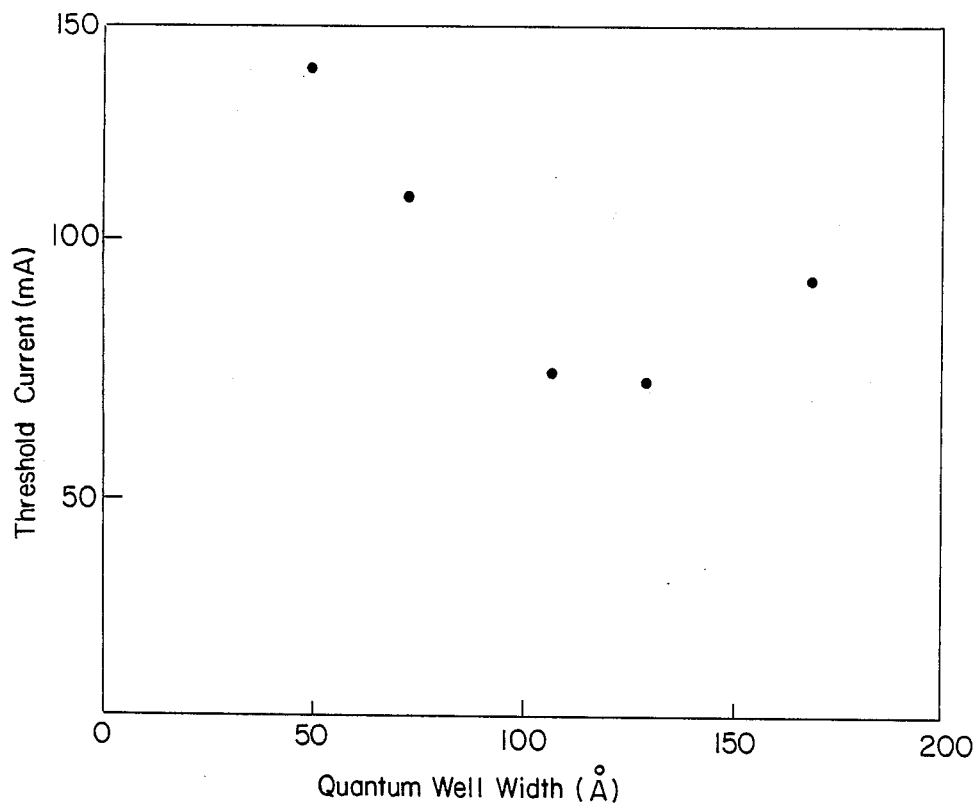
FIG. 5 is a graph showing the dependence of the threshold current on the quantum well width with regard to the semiconductor laser device shown in FIGS. 1 and 2.
Figure 6:
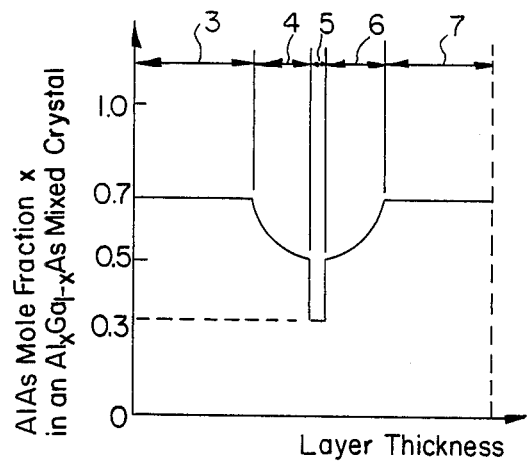
FIG. 6 is a graph showing the AlAs mole fraction (i.e., x) in an $Al_xGa_{1-x}As$ mixed crystal of a conventional GRIN-SCH semiconductor laser device having an oscillation wavelength in the visible region.

FIG. 5 shows the dependence of the threshold current on the quantum well width Lz with regard to the semiconductor laser device structure shown in FIGS. 1 and 2, indicating that the threshold current level is maintained when the quantum well width Lz is in the range of 100 Å to 150 Å (i.e., 100 Å ≤ Lz ≤ 150 Å) in which the photoluminescent fullwidth lobe of half of the maximum becomes minimum. Accordingly, when a superlatticed structure is formed by molecular beam epitaxy in a manner to set the quantum well width Lz to be in the range of 100 Å to 150 Å, a semiconductor laser device which oscillates laser light with an oscillation wavelength in the visible region at a low threshold level can be obtained. The optimum range of the quantum well width Lz of the semiconductor laser device of this invention is about double that of the quantum well width, 60 Å to 80 Å, of the conventional semiconductor laser device provided with a GaAs quantum well.

In the same manner as the above-mentioned, the superlatticed structures constituted by the $(Al_{0.28}Ga_{0.72}As)_2(GaAs)_2$ and the $(Al_{0.4}Ga_{0.6}As)_2(GaAs)_2$, respectively, were examined. The results exhibited the same tendency as those shown in FIGS. 4 and 5, and it was observed that the optimum range of the quantum well width Lz was in the range of 100 Å to 150 Å (i.e., 100 Å $\leq$ Lz $\leq$ 150 Å) when the quantum well layer was constituted by a superlatticed structure, each layer of which was extremely thin (e.g., five molecular layers or less).

Although the above-mentioned example only discloses a GRIN-SCH semiconductor laser device having a single quantum well region, this invention is, of course, applicable to other SCH semiconductor laser devices and/or multi-quantum well structure laser devices having a plurality of quantum well regions.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a single or a plurality of quantum well regions formed by a superlatticed structure, said superlatticed structure is composed of alternate layers consisting of thin GaAs layers and thin $Al_xGa_{1-x}As$ ($0 < x < 1$) layers, each of said layers having a thickness of five molecular layers or less and each of said quantum well regions having a thickness in the range of 100 Å to 150 Å.

2. A semiconductor laser device according to claim 1, wherein the threshold current level is maintained to be at the minimum when the quantum well width is in the range of 100 Å to 150 Å where the photoluminescent full-width lobe of half of the maximum becomes minimum

* * * * *